(12) United States Patent
Cho

(10) Patent No.: US 7,082,448 B2
(45) Date of Patent: Jul. 25, 2006

(54) APPARATUS AND METHOD FOR GENERATING PN STATES

(75) Inventor: Kyong Kuk Cho, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 592 days.

(21) Appl. No.: 10/135,694

(22) Filed: May 1, 2002

(65) Prior Publication Data

US 2003/0016691 A1    Jan. 23, 2003

(30) Foreign Application Priority Data

May 2, 2001    (KR) ............................... 2001-23815

(51) Int. Cl.
*G06F 1/02*    (2006.01)
(52) U.S. Cl. .................................... 708/250
(58) Field of Classification Search ......... 708/250–256
See application file for complete search history.

(56) References Cited

U.S. PATENT DOCUMENTS

| | | | | |
|---|---|---|---|---|
| 4,023,026 A | * | 5/1977 | O'Farrell ..................... 708/252 |
| 5,519,736 A | * | 5/1996 | Ishida ......................... 708/256 |
| 5,532,695 A | * | 7/1996 | Park et al. .................. 708/250 |
| 5,974,433 A | * | 10/1999 | Currie ......................... 708/252 |
| 6,141,374 A | * | 10/2000 | Burns .......................... 708/250 |
| 6,246,676 B1 | | 6/2001 | Chen et al. |
| 6,295,301 B1 | * | 9/2001 | Asano ......................... 370/514 |
| 6,339,781 B1 | | 1/2002 | Sasaki |
| 6,526,427 B1 | * | 2/2003 | Chiskis et al. .............. 708/250 |
| 6,594,680 B1 | * | 7/2003 | Gu et al. .................... 708/256 |
| 6,650,687 B1 | * | 11/2003 | McDonough ............... 708/250 |
| 6,735,606 B1 | * | 5/2004 | Terasawa et al. ........... 708/252 |
| 6,766,337 B1 | * | 7/2004 | Bae et al. ................... 708/250 |
| 6,816,876 B1 | * | 11/2004 | Jha et al. .................... 708/252 |

* cited by examiner

*Primary Examiner*—Kakli Chaki
*Assistant Examiner*—Chat C. Do
(74) *Attorney, Agent, or Firm*—Fleshner & Kim, LLP

(57) ABSTRACT

The present invention relates to an apparatus and a method for generating wanted previous PN states using a clock signal once. More specifically, the apparatus includes a PN code generator for generating current PN states composed of current PN state values that are outputted from each end of N shift registers; an expanded PN code generator for generating N-1 previous state values of the shift register using the current state values; and a means for outputting time-shifted PN states by operating the current state values and the N-1 previous state values together with a PN mask value, thereby shortening a great amount of time required to generate the previous PN states.

6 Claims, 4 Drawing Sheets

APPARATUS AND METHOD FOR GENERATING PN STATES

BACKGROUND OF THE INVENTION

1. Field of the Invention

The present invention generally relates to an apparatus for generating pseudo-noise (PN) code states in a mobile communication system, and more particularly, to an apparatus and a method for generating time-shifted PN states.

Therefore, the present invention, being capable of generating the current PN states and the previous PN states, is applicable to a direct sequence spread spectrum (DS-SS) system or a frequency hopping spread spectrum (FH-SS) system.

2. Description of the Related Art

Although the technology for commercializing the code division multiple access (CDMA) digital mobile telephone system has been developed very recently, the CDMA theory was already established back in 1950's, and it has been used in military communication. Especially, wiretapping prevention is very important in military communication. Among others, the spread spectrum, a basis of the CDMA technology, became a big help to the military to shun off any form of wiretapping.

During the meantime, Qualcomm, Inc., of the United States found the way to apply the frequency spread spectrum to the CDMA technology that was mainly used in military communication. Thanks to the newly developed CDMA technology, a number of subscribers are able to share time and frequency, transceiving signals one another.

In other words, every subscriber in the CDMA is not distinguished by the frequency or time, but by a secrete code, and all subscribers share the identical frequency band. The code in the CDMA is known to terminals and base stations, and it is what is called pseudo-noise code or spread code.

The CDMA approved by TIA in 1993 follows the IS-95 regulation, and each carrier has 1.25 MHz band. In general, the CDMA uses the spread spectrum method, which means that the information for transmission is spread to a much broader band than the original signal. For example, the 9600 bps signal is spread in 1.25 Mbps, and here, the spread means applying another PN code to the original signal. The receiving end adopts the same PN code that was used in the sending end to the 1.25 Mbps spread signal to restore the 9600 bps original signal. Therefore, since the CDMA method spreads the signals to a broad band, the signals after the spread just look like a noise floor, and if the receiving end does not know the PN code applied to the spread, demodulation of the signals are not possible, making it difficult to do wiretapping at all.

As explained before, the CDMA is based on the spread spectrum communication method, which was not available to the public because it requires very complicated equipment and whose power control is very hard to do especially during the transmission, the development of advanced electronic technology made it possible to apply the CDMA to the mobile communication system as well.

In general digital communication, the data to be transmitted goes through digital modulation, like phase shift keying (PSK) or frequency shift keying (FSK) method. However, in the spread spectrum communication, a high-speed spread code is multiplied to the digital modulated signal to expand the bandwidth of the frequency to a broadband, and then the signal is transmitted. In the meantime, in the receiving side, the same high-speed spread code used in the sending side is multiplied to the signal, and a despread process which switches the bandwidth of the frequency back to a narrow band is carried out before demodulating the signal.

The currently being used CDMA method spreads signals that originally had 10 KHZ bandwidth to have 1.25 MHZ bandwidth, and these spread signals are equally spread to the broad frequency band, fainting the intensity of the signals compared to the original signals. Accordingly, to receive such spread signals, the entire frequency band has to be examined to realize the existence of the signals, which process is not that easy. That is, as the transmission signal faints, its interference to other signals becomes relatively small, increasing the reliability of security. Also, although the signal that is spread to the broad frequency band might interfere or make noise in the radio path, its influence is only partially considering that broad frequency band, and its strength is considerably weakened, so the speech quality may be greatly improved. Because of these merits, a great number of nations over the world are now using the CDMA method.

In general, the spread spectrum communication method is divided into a frequency hopping method (FH-CDMA) and a direct sequence method (DS-CDMA). At present, many are choosing the direct sequence method over the frequency hopping method.

In the DS-CDMA method, the narrow band data signals are demodulated by the broadband code signal, and each demodulated signal occupies a broad band instantaneously, separating the multipath signals and making the signals join the Rake receiver. In addition, in the DS-CDMA, every user shares the pilot channel and coherent receiving is possible. In contrast, in the FH-CDMA, the narrow band data signals are cut off to different frequency covering a broad band, and every signal occupies the narrow frequency band instantaneously. This method is again divided into fast FH and slow FH according to the number of bit every hop transmits. That is, if the number of bit one hop transmits is approximately one, it is fast FH, and if several, it is slow FH.

In the meantime, the DS-CDMA system divides a service area into small ones called 'cell', and assigns the same frequency band to every cell. Also, all base stations in charge of the cells are to use the PN code that is generated by the same PN code generator, and the code sequence generated here is spaced by offset, giving the uniqueness to each base station. Moreover, each terminal uses the PN code, generated based on the offset information and the unique code of the base station the terminal belongs, to send the transmission information by the band spreading. Then, the receiving end, through the band dispreading process using the same PN code, obtains the wanted information. In short, using a unique PN code for distinguishing the terminal besides the offset information of the base station, the synchronization between the terminal and the base station can be made much faster and easier.

As noted before, the PN code sequence generated by the PN code generator is used to make broadband spreading signals similar to noise. At this time, the DS-CDMA system uses the PN code sequence to spread the frequency band, while the FH-CDMA system uses the PN state as a frequency hopping pattern. Here, the PN code sequence indicates the outputted element (code value) every moment as a bit unit, and the PN state indicates the outputted element every moment as several bit unit.

Normally, in the mobile communication system, transmission delay exists between the sending side and the receiving side. Naturally, the PN state for use of the spectrum spread should have a PN state in accordance with the time shift to match the synchronization for demodulating the information on the sending side that has been received belatedly. Thus, an apparatus for generating PN states that enables to generate not only the current PN states but also the previous or future PN states according to the time shift is required.

FIG. 1 is a block diagram of a known apparatus for generating PN states.

Referring to FIG. 1, the PN state generating apparatus in the prior art includes a PN code generator 10 for generating N-bit PN code sequence, and a clock controller 20 for applying a clock signal to enable the PN code generator 10 to generate the PN code sequence.

Thusly configured time-shifted PN state in the prior art generates a clock signal from the clock controller 20 based on the offset information to apply the clock signal to the PN code generator 10, and the PN code generator 10, under the clock signal, generates a PN code sequence. At this time, by adjusting the clock signal generated in accordance with the offset information, the PN code generator 10 generates PN states. And, using a PN mask, the PN state that is outputted from the PN code generator can be converted to a time-shifted PN state.

However, in such conventional method, since the time-shifted PN state was generated by controlling the clock controller 20 according to the offset information, it took a considerable amount of time to obtain a wanted time-shifted PN state. For instance, if a user wishes to generate a time-shifted PN state corresponding to the time difference 3 for one time offset, the clock signal had to be applied three times consecutively for that one time offset.

SUMMARY OF THE INVENTION

It is, therefore, an object of the present invention to provide an apparatus and a method for generating time-shifted pseudo-noise (PN) states more easily by applying a simple circuit for obtaining previous PN state.

To achieve the above object, there is provided an apparatus for generating PN states including: a PN code generator for generating current PN states composed of current PN state values that are outputted from each stage of N shift registers; an expanded PN code generator for generating N−1 previous state values of the shift register stage using the current state values; and a means for outputting time-shifted PN states by operating the current state values and the N−1 previous state values together with a PN mask value.

According to the PN state generating apparatus, the expanded PN code generator can output N−1 clock previous PN state values from the 1 clock previous PN state of the top stage of the shift register.

According to the PN state generating apparatus, the time-shifted PN state is a combination of N time-shifted state values that are outputted in parallel in result of the operation of the current state values and the N−1 previous state values with N PN mask values.

In addition, according to the PN state generating apparatus, the expanded PN code generator can generate N−1 top level stage state values of the shift register by selectively performing an exclusive OR operation on the current PN state values.

Another preferred embodiment of the present invention provides a method for generating PN states, which includes the steps of: generating current state values of each stage of N shift registers in parallel; generating N−1 previous state values of a top stage of the shift register based on the current state values; and outputting time-shifted PN states though operating the N state values and the N−1 previous state values with PN mask values.

According to the PN state generating method, the previous state values could be N−1 clock previous state values in the 1 clock previous state.

Further, according to the PN state generating method, the N current state values and the N−1 previous state values can go through an AND operation and an exclusive OR operation with each PN mask signal.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 1:
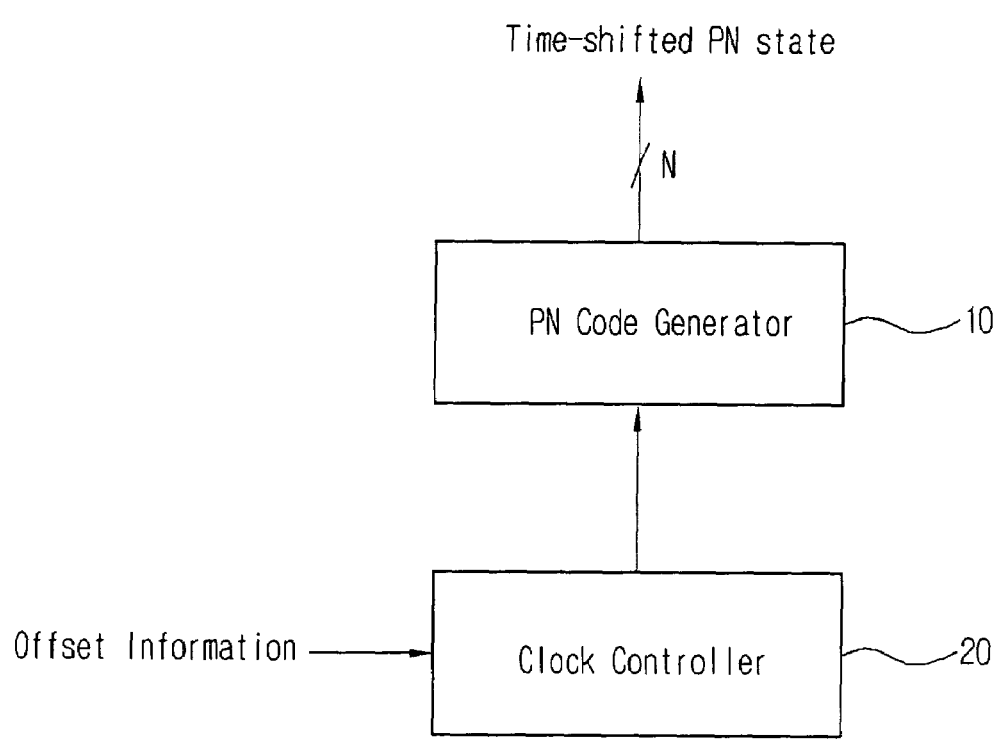
FIG. 1 is a block diagram of a known apparatus for generating pseudo-noise (PN) states.
Figure 2:
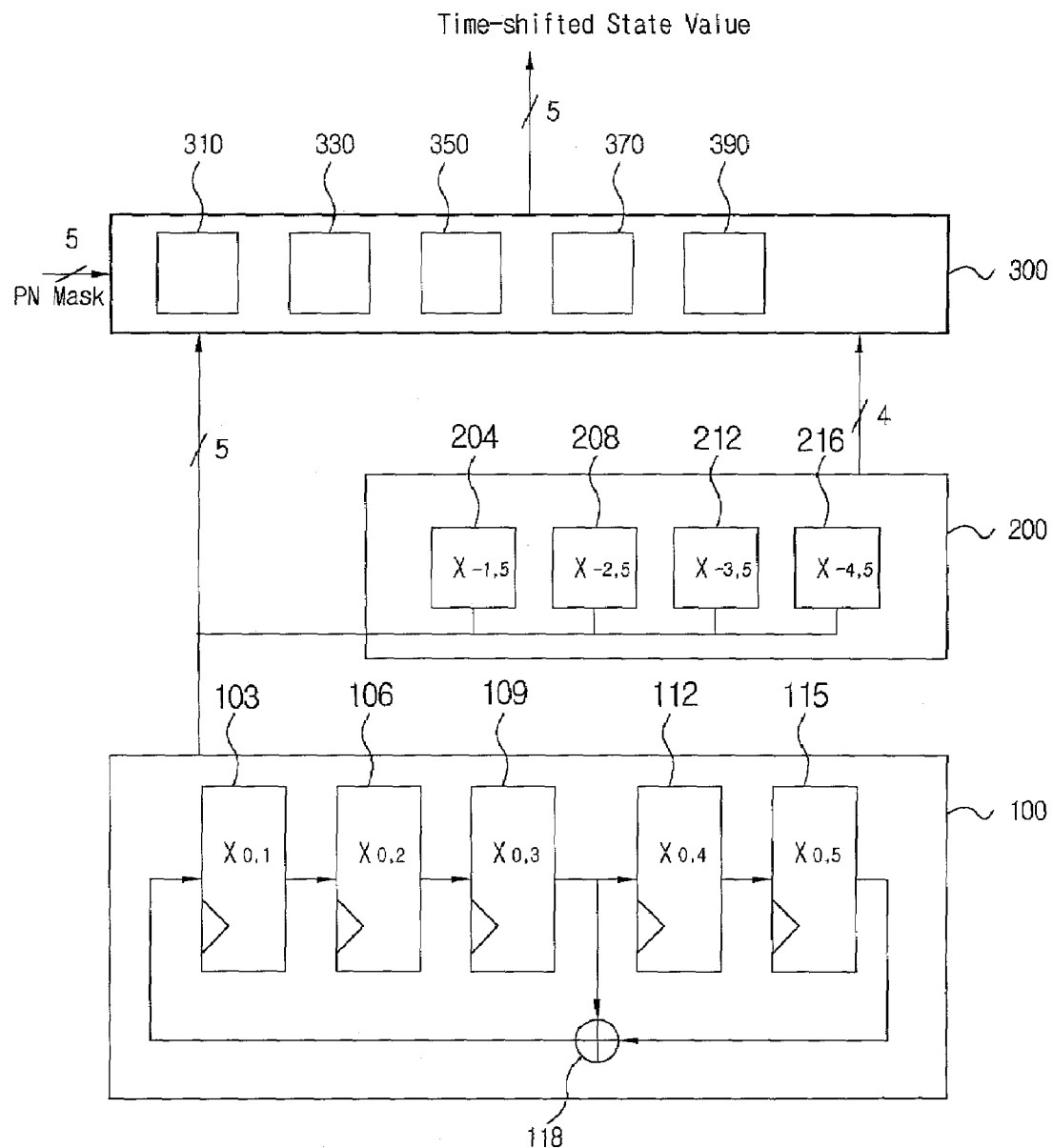
FIG. 2 is a block diagram of an apparatus for generating PN states in accordance with a preferred embodiment of the present invention.
Figure 3:
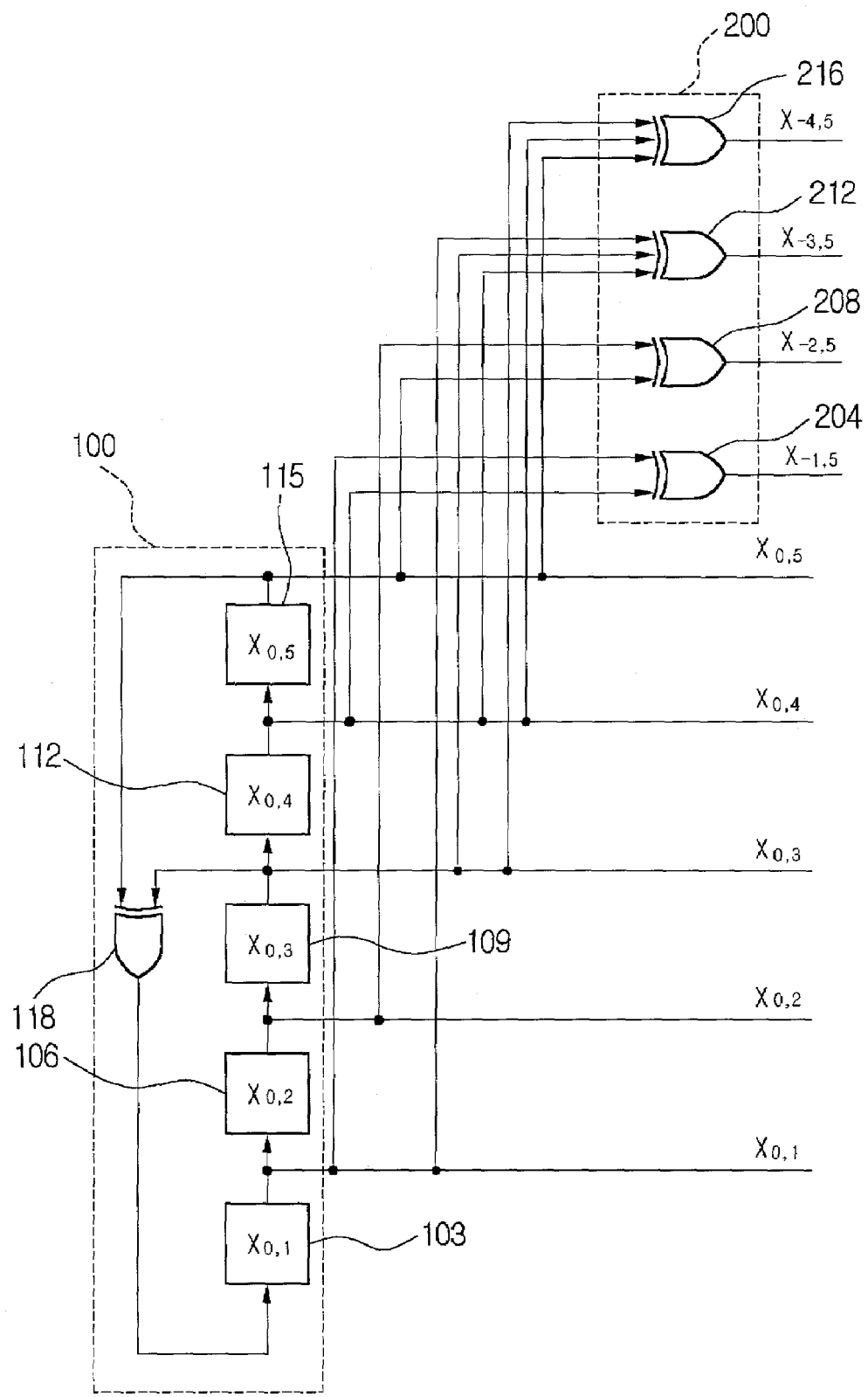
FIG. 3 is a detailed circuit diagram illustrating a PN code generator and an expanded PN code generator of FIG. 2.
Figure 4:
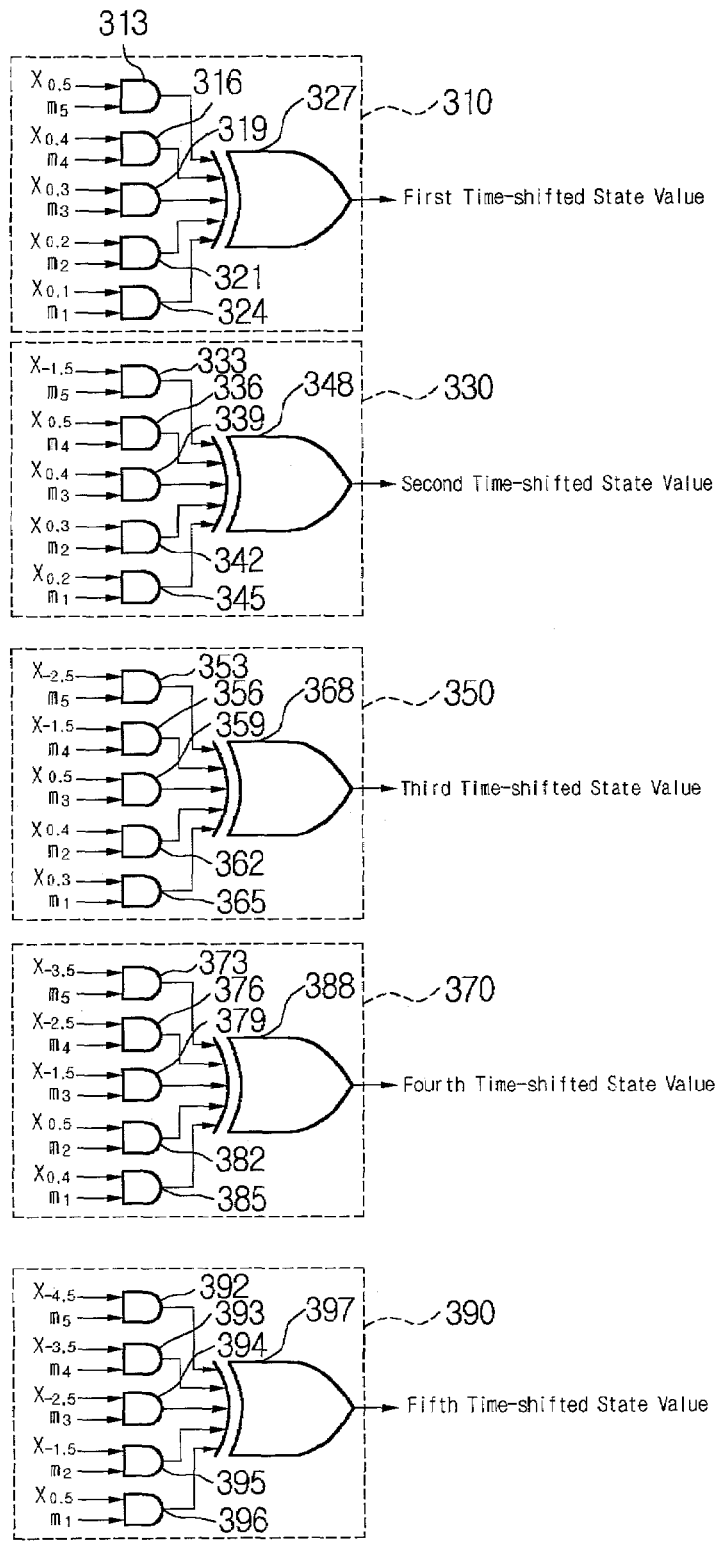
FIG. 4 is a detailed circuit diagram illustrating a PN mask converter of FIG. 2.

FIG. 2 is a block diagram of an apparatus for generating pseudo-noise (PN) states in accordance with a preferred embodiment of the present invention, and FIGS. 3 and 4 are circuit diagrams of a 5-stage PN code generator, an expanded PN code generator and a PN mask converter.

With reference to FIG. 2, the PN state generating apparatus includes a PN code generator 100, an expanded PN code generator 200, and a PN mask converter 300. Here, the PN code generator 100 preferably has a linear feedback shift register (LFSR) structure.

To briefly explain the present invention, first of all, the PN code generator 100 generates state values that are outputted to each shift register stage. Hereinafter, a set of such state values will be called as 'current state'. Next, the expanded PN code generator 200 operates the current state values, and generates N−1 clock previous state values out of 1 clock. Lastly, the PN mask converter 300 outputs time-shifted PN states through operating the current state values and the previous state values with a PN mask value.

More specifically speaking, the PN code generator 100 generates the current state value, 5 bit, in parallel. In other words, the PN code generator 100, including 5 shift registers 103 through 115 and an exclusive OR gate 118, outputs a state value for each shift register 103 through 115 under a clock control signal. Here, the state values generated by each shift register 103 through 115 of the PN code generator 100 are regarded as the current state value. If the state values the PN code generator 100 generated happen to be the previous state values at that point, the previous state values are regarded as the current state values, and a corresponding circuit for the expanded PN code generator 200 can be designed.

For example, suppose there is a polynomial represented by P (x)=1+x³+x⁵. Then, the input/output relation of each shift register 103 through 115 of the PN code generator 100 can be depicted as in FIG. 2. Here, a first shift register 103 is connected to a second shift register 106, the second shift register 106 is connected to a third shift register 109, and the third shift register 109 is consecutively connected to a fourth and a fifth shift registers 112 and 115. In addition, the PN code generator 100 includes an exclusive OR gate 118 for inputting outputted values from the third shift register 109 and the fifth shift register 115 to the first shift register 103 after performing an exclusive OR operation on the outputted values. Accordingly, in case a clock signal is inputted into each shift register 103 through 115, the state values stored in every shift register 103 through 115 are stored in a next shift register and at the same time, could be outputted to the outside. At this point, if the clock signal is applied to each shift register 103 through 115 at the same time, the state values that are outputted from each shift register can be outputted in parallel at once.

Using the current PN state values, the expanded PN code generator 200 can generate top level states for the previous PN states. In short, unlike the traditional method for generating PN state values, in which a PN state value was generated based on the offset information in order to obtain one single PN state value, the present invention made it possible to generate a plurality of PN state values at once by using the expanded PN code generator 200. Therefore, one could say that the expanded PN code generator 200 is the most important core device for the present invention.

Provided next is more detailed explanation on how the expanded PN code generator 200 is configured and works with reference to the polynomial P (x)=1+x³+x⁵.

Suppose that the current PN state values ($X_0$) of the polynomial are represented as $X_0=(x_{0,1}, x_{0,2}, x_{0,3}, x_{0,4}, x_{0,5})$ and 1 clock previous PN state values ($X_{-1}$) are represented as $X_{-1}=(x_{-11}, x_{-1,2}, x_{-1,3}, x_{-1,4}, x_{-1,5})$, then the current PN state calculated from the mathematical formula I below.

$$X_0 = PX_{-1} \quad \text{[Mathematical Formula I]}$$

wherein, P is a 5×5 matrix corresponding to the 5-bit PN state values, and $X_{-1}$ is a previous PN state corresponding to a shift register front-stage of the current PN state.

Here, the matrix P can be expressed as shown in the following mathematical formula II.

$$P = \begin{vmatrix} 0 & 0 & 1 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 0 \end{vmatrix} \quad \text{[Mathematical Formula II]}$$

Therefore, using the mathematical formula I, the 1 previous PN state values can be obtained from the current PN state values, which can be expressed as shown in the following mathematical formula III.

$$X_{-1} = P^{-1}X_0 \quad \text{[Mathematical Formula III]}$$

Here, $P^{-1}$ is an inverse matrix of P, as shown in the mathematical formula IV.

$$P^{-1} = \begin{vmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 1 & 0 \end{vmatrix} \quad \text{[Mathematical Formula IV]}$$

From the mathematical formulas III and IV, the 1 clock previous PN state values can be expressed as in the following mathematical formula V.

$$x_{-1,1} = x_{0,2}$$

$$x_{-1,2} = x_{0,3}$$

$$x_{-1,3} = x_{0,4}$$

$$x_{-1,4} = x_{0,5}$$

$$x_{-1,5} = x_{0,1} + x_{0,4} \quad \text{[Mathematical Formula V]}$$

Here, + indicates an exclusive OR gate, and $x_{-1,5}$ is a result of the exclusive OR operation on the state values that are outputted from the first shift register 103 and the fourth shift register 112, respectively, of the PN code generator 100 shown in FIG. 2. The $x_{-1,5}$ can be easily calculated from the PN code generator 100.

As apparent in the above, the first state value ($x_{1,1}$) to the fourth state value ($x_{-1,4}$) of the 1 clock previous state correspond to the second state value ($x_2$) to the fifth state value ($x_{05}$), except that the fifth state value ($x_{1,5}$) among the 1 clock previous state values, namely, the state value of the e shift register can be outputted through an exclusive OR operation on the first state value ($x_{0,1}$) and the fourth state value ($x_{0,4}$) of the current state values.

In other words, the second state value ($x_{0,2}$) outputted from the second shift register 106 of the current state the PN code generator 100 of FIG. 2 outputted is the first state value outputted from a one previous first shift register 103, which was previously stored in the second shift register 106 when it was outputted from the first shift register 103 and then was outputted later from the second shift register 106 as the present clock signal is applied.

If it needs to obtain a two previous PN state from the current PN state, what all needs to do is to multiply the inverse matrix, $P^{-1}$, by the one previous PN state.

Thus calculated two previous PN state values can be expressed as shown in the following mathematical formula VI.

$$x_{-2,1} = x_{-1,2} = x_{0,3}$$

$$x_{-2,2} = x_{-1,3} = x_{0,4}$$

$$x_{-2,3} = x_{-1,4} = x_{0,5}$$

$$x_{-2,4} = x_{-1,5} = x_{0,1} + x_{0,4}$$

$$x_{-2,5} = x_{-1,1} + x_{-1,4} = x_{0,2} + x_{0,5} \quad \text{[Mathematical Formula VI]}$$

Here, + indicates an exclusive OR gate. As shown in the above, the two previous PN state values listed in the mathematical formula 6 can be easily derived from the outputted values from each shift register 103 through 115 of the PN code generator 100. Besides, since the first state value ($x_{-2,1}$) to the fourth state value ($x_{-2,4}$) in the two previous PN state are obtained by the same method with the one previous PN state, only the fifth state value ($x_{-2,5}$) of the two previous PN state needs to be obtained in order to find out every state value of the two previous PN state.

Similarly, the three previous PN state and the four previous PN state values can be obtained very easily from the state values outputted from the PN code generator 100. Also, as indicated before, only top level state values of the three previous PN state and the four previous PN state are needed.

To be short, to obtain the time-shifted PN states using the 5-stage PN code generator 100, all one needs is a circuit for calculating the top stage state value of each state, generating the wanted time-shifted PN state values.

To this stage, the expanded PN code generator 200 is additionally added as depicted in FIG. 2.

Referring to FIGS. 2 and 3, the expanded PN code generator 200 is now explained. First of all, the expanded PN code generator 200 includes a first through a fourth previous PN state value generators 204 through 216 for generating top stage state values of the first previous through the fourth previous PN states. Here, the first through the fourth previous PN state value generators 204 through 216 are preferably an exclusive OR gate. Therefore, the first through the fourth previous PN state value generators 204 through 216 generate the top stage state value of the one previous PN state ($x_{-1,5}$), the top stage state value of the two previous PN state ($x_{-2,5}$), the top stage state value of the three previous PN state ($x_{-3,5}$), and the top stage state value of the four previous PN state ($x_{-4,5}$), respectively.

More particularly, the first previous PN state value generator 204 generates the top stage state value of the one previous PN state by performing an exclusive OR operation on the state values outputted from the first shift register 103 and the fourth shift register 112 of the PN code generator 100.

Similarly, the second previous PN state value generator 208 generates the top stage state value of the two previous PN state by performing an exclusive OR operation on the state values outputted from the second shift register 106 and the fifth shift register 115 of the PN code generator 100.

Further, the third previous PN state value generator 212 generates the top stage state value of the three previous PN state by performing an exclusive OR operation on the state values outputted from the first shift register 103, the third shift register 109 and the fourth shift register 112 of the PN code generator 100.

Lastly, the fourth previous PN state value generator 216 generates the top stage state value of the four previous PN state by performing an exclusive OR operation on the state values outputted from the second shift register 106, the fourth shift register 112 and the fifth shift register 115 of the PN code generator 100.

In the meantime, the PN mask converter 300 generates time-shifted state values using each outputted state value from the PN code generator 100 and the expanded PN code generator 200. Therefore, by combining the generated time-shifted state values, a time-shifted PN state can be generated as desired.

To explain the PN mask converter 300 with reference to FIGS. 2 and 4, the PN mask converter 300 includes five mask units 310 through 390 from a first mask unit through a fifth mask unit for outputting five time-shifted state values. Each mask unit 310 through 390, based on the outputted stage values from the PN code generator 100 and the expanded PN code generator 200, can output one time-shifted state value through a mask operation using a PN mask signal. To this stage, each mask unit 310 through 390 could include five AND gates 313 through 324, and one exclusive OR gate 327. Accordingly, inputted into the five AND gates are five out of nine state values that were outputted from the PN code generator 100 and the expanded PN code generator 200, and the five AND gates perform an AND operation on the five inputted state values and the PN mask signal. The exclusive OR gate receives all signals outputted from the five AND gates, and carries out the exclusive OR operation thereon to output one single time-shifted state value.

More specifically, the first mask unit 310 receives five state values from the low-order state values to the top state values ($x_{0,1}$, $x_{0,2}$, $x_{0,3}$, $x_{0,4}$, $x_{0,5}$) of the PN code generator 100, and performs the AND operation on each state value with the PN mask signal. Then, the first mask unit 310 performs the exclusive OR operation on those outputted signals that underwent the AND operation, and generates a first time-shifted state value, or the top stage time-shifted state value.

On the other hand, the second mask unit 330 receives the second stage state values to the top stage state values ($x_{0,2}$, $x_{0,3}$, $x_{0,4}$, $x_{0,5}$) of the PN code generator 100 and the top stage state value ($x_{-1,5}$) of the one previous PN state of the expanded PN code generator 200, and performs the AND operation on each state value with the PN mask signal. Then, the second mask unit 330 performs the exclusive OR operation on those outputted signals that underwent the AND operation, and generates a second time-shifted state value. Here, the second time-shifted state value particularly means the time-shifted state value to the front stage out of the time-shifted state values of the top stage.

Similarly, the third mask unit 350 receives the third stage state values to the top stage state values ($x_{0,3}$, $x_{0,4}$, $x_{0,5}$) of the PN code generator 100 and the top stage state values ($x_{-1,5}$, $x_{-2,5}$) of the one previous PN state and the two previous PN state of the expanded PN code generator 200, and performs the AND operation on each state value with the PN mask signal. Then, the third mask unit 350 performs the exclusive OR operation on those outputted signals that underwent the AND operation, and generates a third time-shifted state value. Here, the third time-shifted state value particularly means the time-shifted state value to the previous front stage out of the time-shifted state values of the top stage.

Further, the fourth mask unit 370 receives the fourth stage state value and the top stage state values ($x_{0,4}$, $x_{0,5}$) of the PN code generator 100 and the top stage state values ($x_{-1,5}$, $x_{-2,5}$, $x_{-3,5}$) of the one previous through the three previous PN states of the expanded PN code generator 200, and performs the AND operation on each state value with the PN mask signal. Then, the third mask unit 350 performs the exclusive OR operation on those outputted signals that underwent the AND operation, and generates a fourth time-shifted state value. Here, the fourth time-shifted state value particularly means the time-shifted state value to the third previous stage out of the time-shifted state values of the top stage.

Lastly, the fifth mask unit 390 receives the top stage state values ($x_{0,5}$) of the PN code generator 100 and the top stage state values ($x_{-1,5}$, $x_{-2,5}$, $x_{-3,5}$, $x_{-4,5}$) of the one previous through the four previous PN states of the expanded PN code generator 200, and performs the AND operation on each state value with the PN mask signal. Then, the third mask unit 350 performs the exclusive OR operation on those outputted signals that underwent the AND operation, and generates a fifth time-shifted state value. Here, the fifth time-shifted state value particularly means the time-shifted state value to the fourth previous stage out of the time-shifted state values of the top stage.

Shortly speaking, by combining the time-shifted state values outputted through each mask unit, one time-shifted state can be generated. The same, that is, the generation of the wanted time-shifted state for one time difference, can be accomplished by controlling the PN mask signal. For instance, if the time-shifted state corresponding to the three previous state, the PN mask signal corresponding to the three previous state should be applied to the PN mask converter 300. Then, the PN mask signal is inputted in each AND gate of each mask unit, and the exclusive OR operation is performed on the signal, generating one time-shifted state per mask unit. In other words, combining and arranging each time-shifted state value can create the time-shifted state corresponding to the three previous state.

In conclusion, the apparatus for generating PN states of the present invention, particularly the expanded PN code generator added upon the PN code generator 100 of the present invention, enables to generate a wanted time-shifted state at any time using a PN mask signal, and cuts down a considerable amount of the time required to obtain a wanted time-shifted state.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An apparatus for generating time-shifted pseudo-noise (PN) states, the apparatus comprising:
    a PN code generator for generating current N number of PN state values from each stage of N shift registers;
    an expanded PN code generator for generating N−1 number of previous state values of an Nth shift register from 1 clock to N−1 using a combination of the current PN state values; and
    an outputting unit for outputting N number of time-shifted PN states by operating the N number of the current state values and the N−1 number of previous time state values of the Nth shift register together with a PN mask values.

2. The apparatus of claim 1, wherein the time-shifted PN state is a combination of the N number of current PN state values and the N−1 number of previous state values with N PN mask values.

3. The apparatus of claim 1, wherein the expanded PN code generator generates the N−1 previous state values of the Nth shift register by selectively performing an exclusive OR operation on the N number of current PN state values.

4. A method for generating time-shifted pseudo-noise (PIN) states, the method comprising:
    generating N number of current PN state values from each stage of N shift registers in a PN code generator;
    generating N−1 number of previous state values of an Nth shift register from 1 clock to N−1 clock based on a combination of the current PN state values; and
    outputting N number of time-shifted PN state values by operating the N number of current state values and the N−1 number of previous time state values of the Nth shift register together with a PN mask values.

5. The method of claim 4, wherein the N number of current PN state values and the N−1 number of previous state values go through an AND operation and an exclusive OR operation with each PN mask value.

6. The method of claim 4, wherein generating the N−1 previous state values of the Nth shift register comprises selectively performing an exclusive OR operation on the N number of current PN state values.

* * * * *